(12) United States Patent
Nagashima et al.

(10) Patent No.: US 6,219,245 B1
(45) Date of Patent: Apr. 17, 2001

(54) ELECTRICALLY ISOLATED POWER SWITCHING DEVICE MOUNTING ASSEMBLY FOR EMI REDUCTION

(75) Inventors: James Nagashima, Cerritos; Terence G. Ward, Redondo Beach; Scott D. Downer, Torrance, all of CA (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/551,249

(22) Filed: Apr. 18, 2000

(51) Int. Cl.[7] ........................................... H05K 7/20
(52) U.S. Cl. .................. 361/705; 361/704; 361/719; 361/707; 361/818; 174/35 R; 257/718; 165/104.33
(58) Field of Search ..................... 361/702–719, 361/600, 679, 686, 687–689, 701, 713–723, 816, 818, 735, 736, 750, 752, 753, 683, 685, 804; 165/80.3, 80.4, 46, 146, 104.33, 185; 174/50–51, 50.52, 16.3, 35 MS, 50.54, 58, 35 R, 35 GC; 428/64, 65, 195, 522; 29/390.03, 521, 505, 557; 251/712–718, 706–708, 746, 747, 668, 684, 796, 692, 687; 318/139, 494, 504, 432–433; 364/424.01; 307/9.1, 10.1, 147, 58, 45, 82; 363/141

(56) References Cited

U.S. PATENT DOCUMENTS

| | | | |
|---|---|---|---|
| 4,692,839 | * | 9/1987 | Lee et al. ............................ 361/386 |
| 5,392,197 | * | 2/1995 | Cuntz et al. ........................ 361/818 |
| 5,418,685 | * | 5/1995 | Hussmann et al. ................. 361/719 |
| 5,444,295 | * | 8/1995 | Lake et al. .......................... 257/678 |
| 5,504,378 | * | 4/1996 | Lindberg et al. ................... 307/10.1 |
| 5,508,594 | * | 4/1996 | Underwood et al. ............... 318/139 |
| 5,517,063 | * | 5/1996 | Schantz et al. ..................... 307/9.1 |
| 5,594,199 | * | 1/1997 | Ciaccio ............................... 174/35 R |
| 5,631,821 | * | 5/1997 | Muso .................................. 363/141 |
| 5,751,058 | * | 5/1998 | Matsuki .............................. 257/692 |
| 5,920,119 | * | 7/1999 | Tamba et al. ....................... 257/718 |
| 5,926,372 | * | 7/1999 | Rinehart et al. .................... 361/704 |
| 5,966,291 | * | 10/1999 | Baumel et al. .................... 361/707 |
| 6,016,007 | * | 1/2000 | Sanger et al. ...................... 257/714 |
| 6,054,676 | * | 4/2000 | Wall et al. .......................... 219/209 |
| 6,141,219 | * | 10/2000 | Downing et al. ................... 361/704 |

FOREIGN PATENT DOCUMENTS

407194139 * 7/1995 (JP) ............................... H02M/7/48

* cited by examiner

Primary Examiner—Leo P. Picard
Assistant Examiner—Michael Datskovsky
(74) Attorney, Agent, or Firm—Anthony Luke Simon

(57) ABSTRACT

A power electronics chassis (10) and liquid-cooled heat sink mounting assembly for electric vehicles and other applications that use liquid coolant to cool power electronic devices (20) contained within an electrically conductive housing (12). The power electronics chassis (10) includes an inverter (18) containing power switching devices (20) that are heat sunk using the liquid-cooled mounting assembly. The mounting assembly includes a heat exchanger (22) and a plastic, electrically non-conductive coolant manifold (16) that has an inlet (26) and outlet (28) for passage of liquid coolant into and out of the electronics housing (12). The power switching devices (20) are attached to a mounting surface (40) of the heat exchanger (22) and are thermally coupled to the coolant within the heat exchanger (22) via the mounting surface (40). The inlet (26) and outlet (28) of the plastic coolant manifold (16) are connected to the heat exchanger (22) by conduits (30,32) to thereby permit circulation of liquid coolant into the chassis housing (12), through the heat exchanger (22), and back out of the chassis housing (12) while maintaining electrical isolation between the liquid coolant and chassis housing (12). This configuration significantly reduces the radiated EMI by significantly reducing the parasitic capacitance between the switching devices (20) and chassis housing (12).

12 Claims, 1 Drawing Sheet

ELECTRICALLY ISOLATED POWER SWITCHING DEVICE MOUNTING ASSEMBLY FOR EMI REDUCTION

TECHNICAL FIELD

The present invention relates generally to heat sinking of power switching devices and, in particular, to liquid-cooled heat sink assemblies located within the power electronics module of an electric vehicle (i.e., electric and hybrid electric vehicles).

BACKGROUND OF THE INVENTION

Electric vehicles typically utilize an inverter in the form of a switch-mode power supply to provide three phase operating power to the vehicle's electric drive motor. The inverter includes a number of power switching devices that can supply the high currents needed. The inverter is usually located in an environmentally sealed module that is commonly referred to as the power electronics bay (PEB). This module typically includes other electronic circuits, such as those used to run the vehicle's electronic power steering, climate control compressor motor, and traction control system.

In an effort to minimize the amount of electromagnetic interference (EMI) radiated from the inverter and other circuitry within the power electronics bay, the circuits themselves are enclosed together within a grounded metal chassis. This chassis normally includes a housing having feedthrough electrical connectors (for power, control, and data signals) as well as an inlet and outlet coolant manifold that permit liquid coolant to be circulated through the power electronics bay for cooling of the inverter's power switching devices. In a typical liquid-cooled inverter application, the power switching devices are mounted by their baseplates to a conductive metallic liquid-interface heat exchanger. The coolant manifold of the heat exchanger that leads into and out of the chassis is metallic and is attached to the chassis. Thus, there is no electrical isolation between the power switching device baseplates, the heat exchanger and chassis. Where thermal grease or some other non-electrically insulating thermal interface is used between the switching device baseplates and heat exchanger, the baseplates themselves will be electrically connected to both the coolant and chassis. This produces capacitive coupling between the power switching devices and the chassis that is typically about 12–100 pF per die $cm^2$, which can result in as much as 190 pF or more of capacitance. This allows undesirably high currents to be injected into the chassis, resulting in unwanted radiated emissions. Isolation of the baseplates and heat exchanger can be achieved using an insulating thermal interface such as a gasket; however, this seriously degrades the thermal coupling between the baseplates and heat exchanger.

Accordingly, there exists a need for a power electronics liquid-cooled heat sink mounting assembly that maintains good thermal conduction from the power switching devices while reducing the radiated EMI due to currents flowing from the switching devices and into the chassis.

SUMMARY OF THE INVENTION

In accordance with the present invention, there is provided a liquid cooled mounting assembly for heat sinking one or more power switching devices within an electrically conductive electronics housing. The mounting assembly includes a heat exchanger, one or more power switching devices, and an electrically non-conductive coolant manifold. The heat exchanger has a mounting surface and an internal space for containing a volume of liquid coolant within the heat exchanger. The internal space is defined at least in part by a wall having an inner surface that is thermally coupled to the mounting surface. The one or more power switching devices are supported by and thermally coupled to the mounting surface of the heat exchanger such that heat generated by the power switching devices is thermally coupled to the internal space within the heat exchanger. The coolant manifold has an inlet and outlet for passage of liquid coolant into and out of the electrically conductive electronics housing, with the inlet and outlet being in fluidic communication with the internal space of the heat exchanger. Thus, the coolant manifold permits circulation of liquid coolant into the chassis housing, through the heat exchanger, and back out of the chassis housing while maintaining electrical isolation between the liquid coolant and chassis housing.

This configuration not only provides electrical isolation of the coolant from the chassis housing, but does so in a manner that significantly reduces the parasitic capacitance between the switching devices and chassis housing. As a result, when used for an electric vehicle power electronics module containing an inverter for the vehicle's electric drive motor, the invention significantly reduces the radiated EMI outside of the chassis, as compared to conventional liquid-cooled heat sinking assemblies.

BRIEF DESCRIPTION OF THE DRAWINGS

A preferred exemplary embodiment of the present invention will hereinafter be described in conjunction with the appended drawings, wherein like numerals denote like elements, and wherein.

DESCRIPTION OF THE PREFERRED EMBODIMENT

Figure 1:
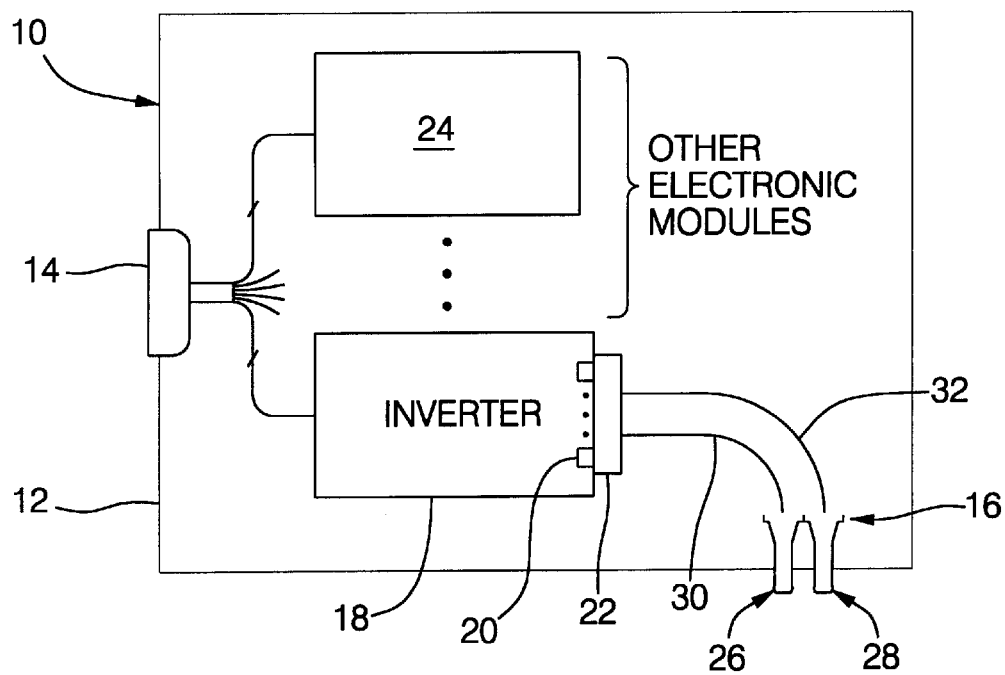
FIG. 1 is a diagrammatic view of an electric vehicle power electronics chassis of the present invention showing various electronic modules contained therein.

Referring first to FIG. 1, there shown a power electronics chassis or enclosure 10 constructed in accordance with the present invention. The chassis 10 includes a metal housing 12 having at least one electrical connector 14 for feedthrough of power, control, and data wires and a plastic coolant manifold 16 for feedthrough of liquid coolant. Contained within housing 12 is an inverter 18 in the form of a switch mode power supply having a number of semiconductor power switching devices 20 that are thermally coupled to a heat exchanger 22. Also contained within housing 12 are a number of other electronic modules 24 that are electrically connected along with inverter 18 to the connector 14.

Coolant manifold 16 includes both an inlet 26 and an outlet 28, each of which has a respective conduit 30, 32 that are used to circulate liquid coolant from inlet 26 into the heat exchanger 22 and back out of the housing 12 via outlet 28. This permits use of the coolant to remove heat from the power switching devices 20 while simultaneously reducing EMI radiated emissions outside of chassis 10. As will be appreciated, power devices utilized in one or more of the other electronic modules 24 can be thermally coupled to heat exchanger 22 to provide suitable heat sinking. Alternatively, the coolant fed into and out of housing 12 via manifold 16 can be passed serially (or in parallel) through other heat exchangers (not shown) to provide heat sinking of power devices in one or more of the other electronic modules 24.

Figure 2:
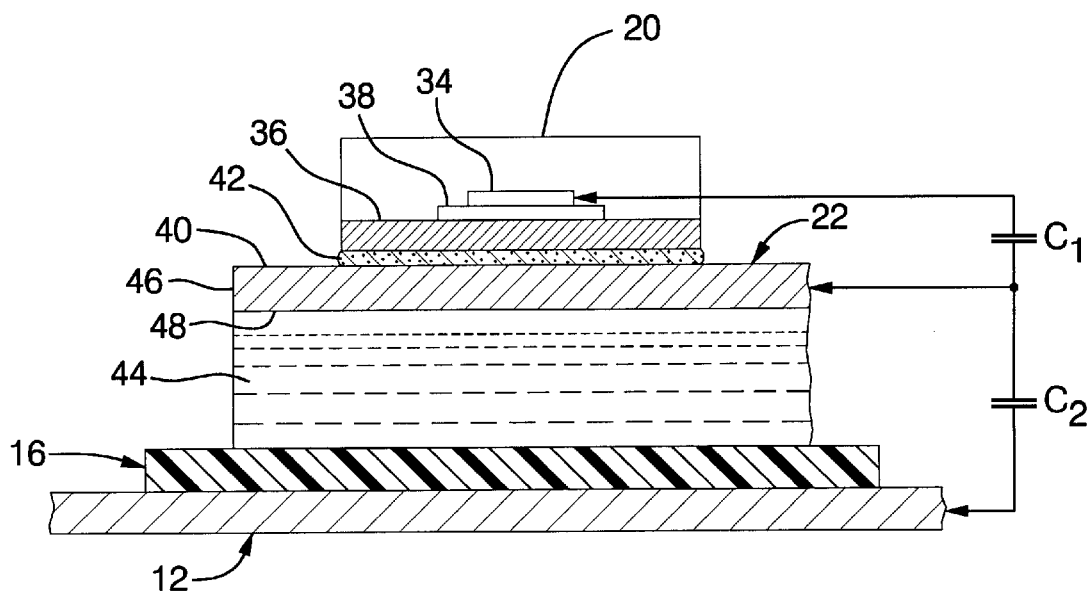
FIG. 2 is a diagrammatic view showing the material stack-up of the heat sinking assembly of FIG. 1 for purposes of illustrating how the invention reduces the capacitive coupling between the switching devices and chassis.

Referring now to FIG. 2, there is shown the material stack-up used in the heat sinking of switching devices 20. It will be appreciated that the view shown in FIG. 2 is diagrammatic only and that the actual construction of the various components shown therein is well within the level of skill in the art. As is known, a typical power switching device 20 such as a power transistor includes a semiconductor device 34 which is mounted to a baseplate or package housing 36 via an insulating layer 38. The semiconductor device 34 is the actual transistor itself and the baseplate 36 comprises a thermally-conductive plate or jacket that is used for heat sinking of the semiconductor device 34. The switching device 20 is mounted by its baseplate 36 to a mounting surface 40 of heat exchanger 22 via a gasket or layer of thermal grease 42 which provides thermal coupling of the baseplate to the heat exchanger.

In addition to mounting surface 40, heat exchanger 22 includes an internal space 44 through which the liquid coolant flows. This internal space is defined at least in part by a metal wall 46 having an inner surface 48 that is thermally coupled to the mounting surface 40. Thus, heat transmitted from baseplate 36 to mounting surface 40 is thermally conducted to the inner surface 48 where it is drawn away by the coolant flowing through the internal space 44. Heat exchanger 22 can be constructed in a conventional manner and it will be understood that the diagrammatic representation of coolant manifold 16 shown in FIG. 2 is not meant to indicate that it forms one of the walls that define internal space 44; rather, it is shown diagrammatically to indicate its use in providing electrical isolation that reduces the EMI generating currents that are injected into the chassis housing.

More specifically, manifold 16 is a plastic component that electrically isolates the liquid coolant from the chassis housing 12. Since the heat exchanger 22 is not otherwise electrically connected to the housing, this isolation helps reduce the parasitic capacitance between the semiconductor device 34 and the housing 10. As indicated in FIG. 2, the total capacitance between these two points is the series combination of parasitic capacitances $C_1$ and $C_2$. The first of these, $C_1$, is typically on the order of 12–100 pF per die $cm^2$ resulting in a typical capacitance of 190 pF or more. The second of these, $C_2$, is one or two orders of magnitude lower, usually less than 4 pF, resulting in a total capacitance to the housing of something slightly less than the value of $C_2$. This provides a theoretical improvement of 12–20 decibels in EMI radiation relative to conventional heat sink topologies.

Although the primary known advantage of the present invention is the reduction of radiated emissions from the chassis, other advantages can be realized as well. For example, the electrical isolation of the coolant from the chassis housing results in lower galvanic activity that could otherwise result in scaling and eventual system failure. Also, since the thermal path from the switching devices is excellent to the liquid coolant, but poor to the chassis housing, coolant manifold 16 helps thermally isolate the switching devices 20 from ambient temperatures surrounding the chassis housing 12.

It will thus be apparent that there has been provided in accordance with the present invention a power electronics chassis and liquid-cooled heat sink mounting assembly which achieves the aims and advantages specified herein. It will, of course, be understood that the foregoing description is of a preferred exemplary embodiment of the invention and that the invention is not limited to the specific embodiment shown. Various changes and modifications will become apparent to those skilled in the art and all such changes and modifications are intended to be within the scope of the present invention.

We claim:

1. A liquid cooled mounting assembly for heat sinking one or more power switching devices within an electrically conductive electronics housing, said mounting assembly comprising:

a heat exchanger having a mounting surface and an internal space for containing a volume of liquid coolant within said heat exchanger, said internal space being defined at least in part by a wall having an inner surface that is thermally coupled to said mounting surface, whereby heat received by said heat exchanger at said mounting surface can be conducted to said internal space;

at least one power switching device supported by and thermally coupled to said mounting surface of said heat exchanger, whereby heat generated by said power switching device is thermally coupled to said internal space within said heat exchanger; and an electrically non-conductive coolant manifold coupled to said heat exchanger, said coolant manifold having an inlet and outlet for passage of liquid coolant into and out of the electrically conductive electronics housing, said inlet and outlet being in fluidic communication with said internal space of said heat exchanger, whereby said coolant manifold permits circulation of liquid coolant into the conductive electronics housing, through said heat exchanger, and back out of the electronics housing while maintaining electrical isolation between the liquid coolant and electronics housing.

2. A mounting assembly as defined in claim 1, wherein said power switching device is thermally coupled to said mounting surface using a non-electrically insulating thermal grease.

3. A mounting assembly as defined in claim 1, wherein said power switching device is thermally coupled to said mounting surface using a thermally conductive gasket.

4. A mounting assembly as defined in claim 1, further comprising a plurality of power switching devices supported by and thermally coupled to said mounting surface of said heat exchanger.

5. A mounting assembly as defined in claim 1, wherein said heat exchanger includes an electrically conductive path between said mounting surface and said internal space.

6. A power electronics chassis, comprising:

an electrically conductive housing having at least one exterior wall;

a heat exchanger located within said housing and being electrically isolated from said housing;

at least one power switching device supported by and thermally coupled to said heat exchanger within said housing, whereby heat generated by said power switching device is thermally coupled to said heat exchanger; and an electrically non-conductive coolant manifold mounted at said exterior wall of said electrically conductive housing, said coolant manifold having an inlet and outlet in fluidic communication with said heat exchanger to permit circulation of liquid coolant into said housing, through said heat exchanger, and back out of said housing through said exterior wall, whereby said coolant manifold provides electrical isolation between said housing and said heat exchanger.

7. A power electronics chassis as defined in claim 6, wherein said power switching device is thermally coupled to said heat exchanger using a non-electrically insulating thermal grease.

8. A power electronics chassis as defined in claim 6, wherein said power switching device is thermally coupled to said heat exchanger using a thermally conductive gasket.

9. A power electronics chassis as defined in claim 6, further comprising a plurality of power switching devices supported by and thermally coupled to said heat exchanger.

10. A power electronics chassis as defined in claim 6, wherein said heat exchanger includes a mounting surface and an internal space for containing a volume of liquid coolant within said heat exchanger, said internal space being defined at least in part by a wall having an inner surface that is thermally coupled to said mounting surface, whereby heat received by said heat exchanger at said mounting surface can be conducted to said internal space.

11. A power electronics chassis as defined in claim 10, wherein said inlet and outlet are coupled to said internal space within said heat exchanger such that liquid coolant entering said housing via said inlet can circulate through said internal space and exit said housing via said outlet.

12. A power electronics chassis as defined in claim 10, wherein said heat exchanger includes an electrically conductive path between said mounting surface and said internal space.

* * * * *